United States Patent
Perera

(10) Patent No.: US 9,136,129 B2
(45) Date of Patent: *Sep. 15, 2015

(54) NON-VOLATILE MEMORY (NVM) AND HIGH-K AND METAL GATE INTEGRATION USING GATE-LAST METHODOLOGY

(71) Applicant: FREESCALE SEMICONDUCTOR, INC., Austin, TX (US)

(72) Inventor: Asanga H. Perera, West Lake Hills, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/041,591

(22) Filed: Sep. 30, 2013

(65) Prior Publication Data

US 2015/0093864 A1 Apr. 2, 2015

(51) Int. Cl.
*H01L 21/336* (2006.01)
*H01L 21/28* (2006.01)
*H01L 27/115* (2006.01)
*H01L 29/66* (2006.01)

(52) U.S. Cl.
CPC .... *H01L 21/28273* (2013.01); *H01L 27/11531* (2013.01); *H01L 29/66825* (2013.01); *H01L 21/28282* (2013.01); *H01L 27/11573* (2013.01)

(58) Field of Classification Search
CPC ............ H01L 27/115; H01L 27/11521; H01L 29/792; H01L 27/11573; H01L 29/66833; H01L 27/11526; H01L 27/11568; H01L 27/11529; H01L 29/42328; H01L 27/10894; H01L 27/10897; H01L 21/28282; H01L 27/1052; H01L 27/11539; H01L 29/4236; H01L 29/66545; H01L 27/1116; H01L 29/66484; H01L 29/7831

See application file for complete search history.

(56) References Cited

U.S. PATENT DOCUMENTS

| | | | |
|---|---|---|---|
| 5,614,746 | A | 3/1997 | Hong et al. |
| 6,087,225 | A | 7/2000 | Bronner et al. |
| 6,194,301 | B1 | 2/2001 | Radens et al. |
| 6,235,574 | B1 | 5/2001 | Tobben et al. |
| 6,333,223 | B1 | 12/2001 | Moriwaki et al. |
| 6,388,294 | B1 | 5/2002 | Radens et al. |

(Continued)

FOREIGN PATENT DOCUMENTS

WO 2009058486 5/2009

OTHER PUBLICATIONS

U.S. Appl. No. 13/781,727, Office Action—Allowance, May 12, 2014.

(Continued)

*Primary Examiner* — Bac Au

(57) ABSTRACT

A method of making a semiconductor structure uses a substrate and includes a logic device in a logic region and a non-volatile memory (NVM) device in an NVM region. An NVM structure is formed in the NVM region. The NVM structure includes a control gate structure and a select gate structure. A protective layer is formed over the NVM structure. A gate dielectric layer is formed over the substrate in the logic region. The gate dielectric layer includes a high-k dielectric. A sacrificial gate is formed over the gate dielectric layer in the logic region. A first dielectric layer is formed around the sacrificial gate. Chemical mechanical polishing is performed on the NVM region and the logic region after forming the first dielectric layer. The sacrificial gate is replaced with a metal gate structure.

20 Claims, 9 Drawing Sheets

(56) References Cited

U.S. PATENT DOCUMENTS

| | | |
|---|---|---|
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,679,927 B2 | 3/2014 | Ramkumar et al. |
| 8,871,598 B1 * | 10/2014 | Perera .......... 438/299 |
| 8,901,632 B1 * | 12/2014 | Perera et al. .......... 257/314 |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

U.S. Appl. No. 13/441,426, Shroff, M. D., et al., Office Action—Allowance, mailed Jun. 9, 2014.
U.S. Appl. No. 13/907,491, Office Action—Rejection, Sep. 3, 2013.
U.S. Appl. No. 13/343,331, Office Action—Allowance, Nov. 8, 2013.
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 14/041,662, Perera, Office Action—Allowance, mailed Oct. 17, 2014.
U.S. Appl. No. 13/442,142, Hall, Office Action—Allowance, mailed Aug. 2, 2013.
U.S. Appl. No. 13/661,157, Office Action—Restriction, mailed Oct. 2, 2014.
Office Action mailed Jan. 31, 2014 in U.S. Appl. No. 13/781,727.
Office Action mailed Nov. 22, 2013 in U.S. Appl. No. 13/780,591.
Office Action mailed Dec. 24, 2013 in U.S. Appl. No. 13/790,225.

(56) References Cited

OTHER PUBLICATIONS

Office Action mailed Dec. 24, 2013 in U.S. Appl. No. 13/790,014.
Office Action mailed Dec. 31, 2013 in U.S. Appl. No. 13/442,142.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao: P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.
U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a NonVolatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.

(56) References Cited

OTHER PUBLICATIONS

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", filed Oct. 26, 2012.

U.S. Appl. No. 13/781,727, Shroff, M., et al., "Methods of Making Logic Transistors and non-Volatile Memory Cells", Office Action—Restriction, Jun. 21, 2013.

Office Action mailed Jan. 16, 2014 in U.S. Appl. No. 13/491,771.

Office Action—Allowance mailed Feb. 21, 2014 in U.S. Appl. No. 13/441,426.

Office Action—Allowance mailed Feb. 28, 2014 in U.S. Appl. No. 13/442,142.

Office Action—Allowance mailed Mar. 3, 2014 in U.S. Appl. No. 13/790,014.

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

\* cited by examiner

US 9,136,129 B2

NON-VOLATILE MEMORY (NVM) AND HIGH-K AND METAL GATE INTEGRATION USING GATE-LAST METHODOLOGY

BACKGROUND

1. Field

This disclosure relates generally to non-volatile memories (NVMs) and logic transistors, and more particularly, integrating NVMs with logic transistors that have high-k gate dielectrics and metal gates using a gate-last methodology.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell in a NVM region of an integrated circuit and a logic transistor in a logic region of the integrated circuit includes forming the gate structure of the NVM cell in the NVM region, including the charge storage layer, while masking the logic region. The logic gate is formed while masking the NVM region with a hard mask that is subsequently used to form sidewall spacers in the NVM region. Source/drain implants are performed simultaneously in the NVM and logic regions. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
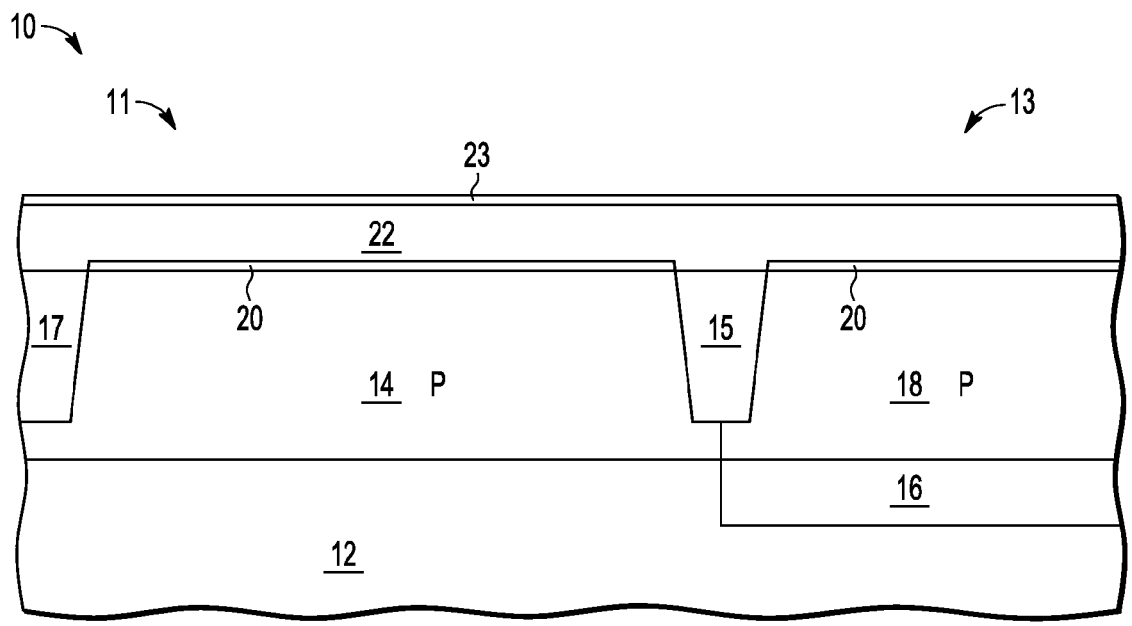
FIG. 1 is a cross section of a semiconductor structure having a non-volatile memory (NVM) structure and a logic transistor structure at a stage in processing according to an embodiment.

Shown in FIG. 1 is a semiconductor structure 10 of an integrated circuit having an NVM region 11 and a logic region 13. Semiconductor structure 10 has a substrate 12, an isolation region 15 separating logic region 13 from NVM region 11, an isolation region 17 in NVM region 11 that, along with isolation region 15, that defines borders of an active region in NVM region 11, a P well 14 in substrate 12 in the NVM region extending from the surface of substrate 12, a P well 18 in logic region 13 that extends from the surface of substrate 12, an N region 16 below P well 18 for aiding in providing noise isolation for the logic transistors, an oxide layer 20 on the top surface of substrate 12 in NVM region 11 and logic region 13. Oxide layer 20 is a thermal oxide that is grown, rather than deposited, for high quality. Over oxide layer 20 and isolation regions 15 and 17 is a polysilicon layer 22 that may be doped in situ or by implant. Nitride layer 23 (also referred to as an optical patterning layer or cap layer) is deposited on polysilicon layer 22 in NVM region 11 and logic region 13. Alternatively, a layer of oxide (not shown) may be deposited over polysilicon layer 22 instead of nitride layer 23. N wells are also formed in other portions of logic region 13, which are not shown, for the forming P channel transistors.

Figure 2:
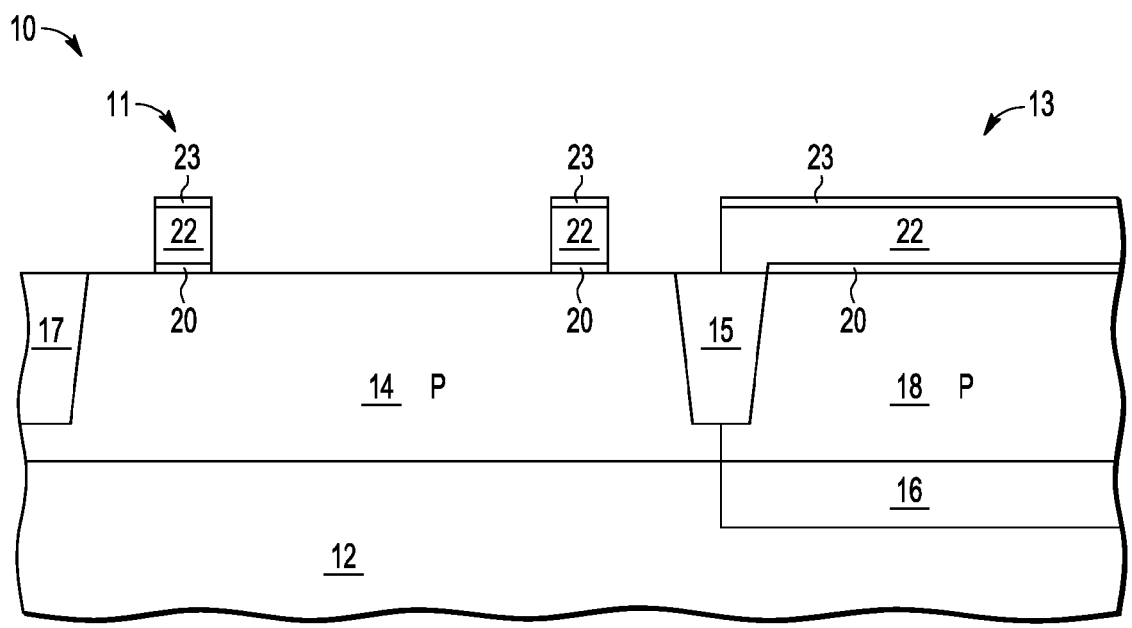
FIG. 2 is a cross section of the semiconductor structure of FIG. 1 at a subsequent stage in processing.

Shown in FIG. 2 is semiconductor structure 10 after patterning cap layer 23, polysilicon layer 22 and oxide layer 20 in NVM region 11 to form select gate structures. Patterning is typically achieved using patterned photoresist.

Figure 3:
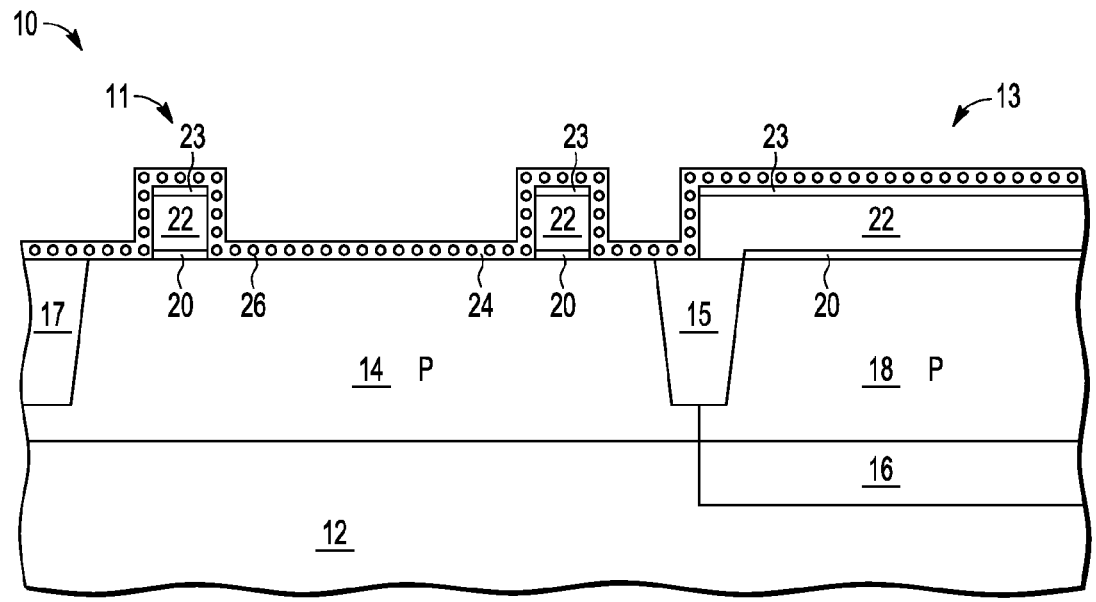
FIG. 3 is a cross section of the semiconductor structure of FIG. 2 at a subsequent stage in processing.

Shown in FIG. 3 is semiconductor structure 10 after forming a charge storage layer 24 having nanocrystals such as nanocrystal 26. Nanocrystal layer is preferably formed by first growing a thermal oxide layer on the exposed top surface of substrate 12 and on the exposed surfaces of polysilicon layer 22 and cap layer 23. This oxide grown on the top surface of substrate 12 is of particular importance because that is where charge will pass during program and erase. The nanocrystals are formed on the grown oxide and a deposited oxide is formed on and around the nanocrystals.

Figure 4:
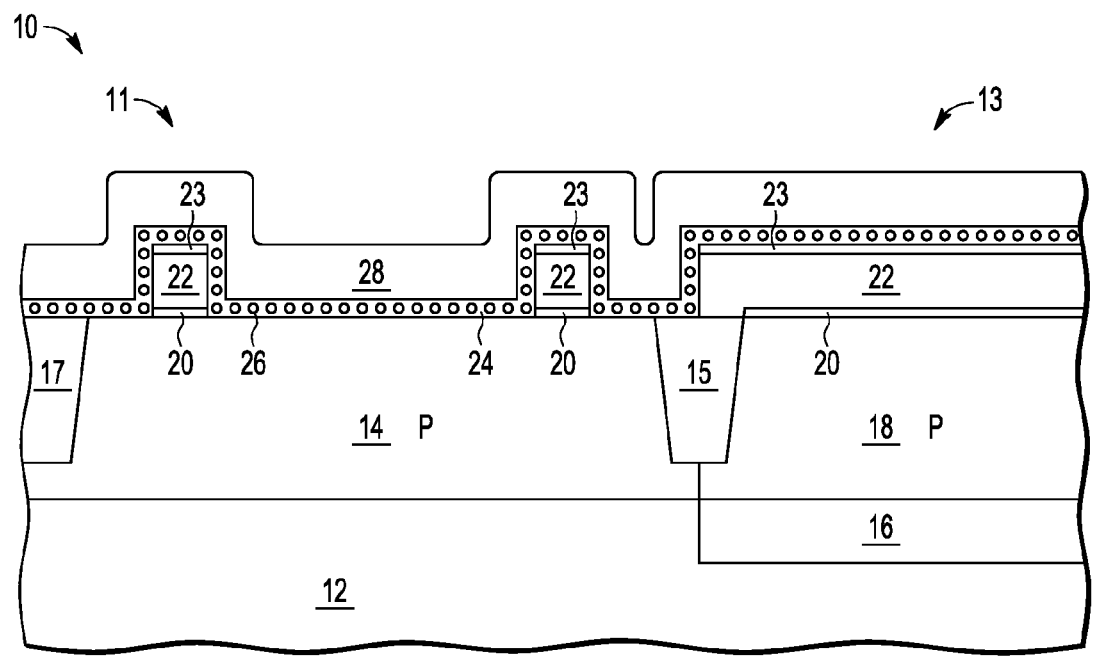
FIG. 4 is a cross section of the semiconductor structure of FIG. 3 at a subsequent stage in processing.

Shown in FIG. 4 is semiconductor structure 10 after depositing a polysilicon layer 28 on charge storage layer 24. This polysilicon layer is made conductive by doping which may be in situ or by implant.

Figure 5:
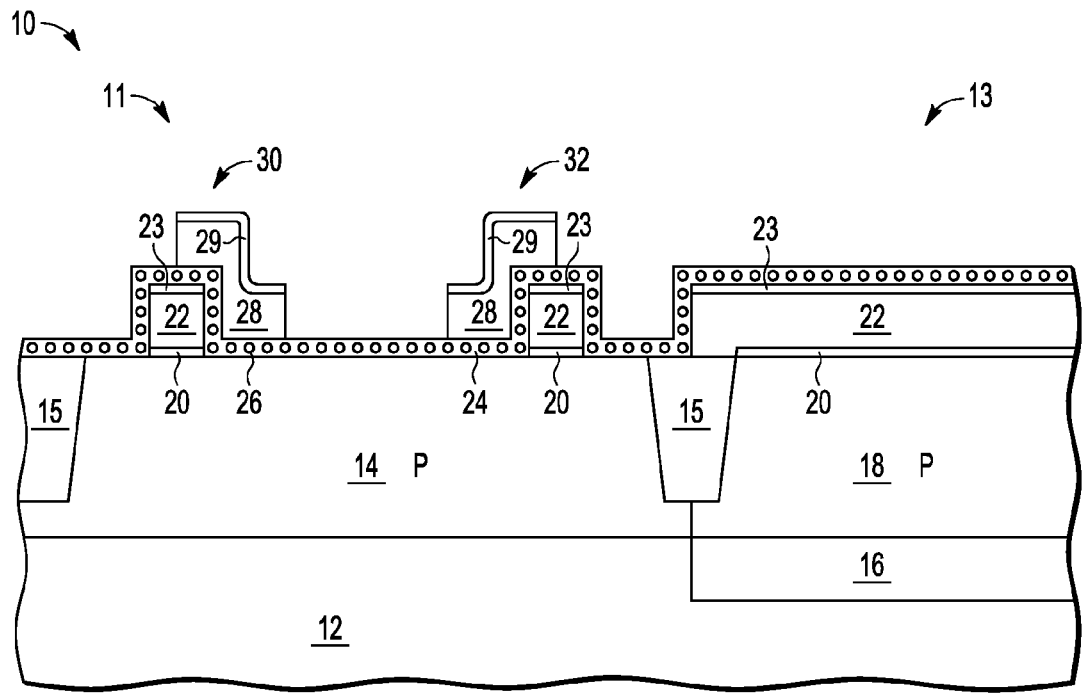
FIG. 5 is a cross section of the semiconductor structure of FIG. 4 at a subsequent stage in processing.

Shown in FIG. 5 is semiconductor structure 10 after an oxide layer 29 is formed on polysilicon layer 28, a patterned photoresist layer is formed on oxide layer 29, and a patterned etch of polysilicon layer 28 and oxide layer 29 is performed that results in NVM gate structures 30 and 32. For NVM gate structure 30, the portion of polysilicon layer 22 is the select gate and the portion of polysilicon layer 28 is the control gate in which a portion of the control gate is over a portion of the select gate and over a portion of the substrate adjacent to a side of the select gate facing NVM gate structure 32. For NVM gate structure 32, the portion of polysilicon layer 22 is the select gate and the portion of polysilicon layer 28 is the control gate in which a portion of the select gate is over a portion of the control gate and over a portion of the substrate adjacent to a side of the select gate facing NVM gate structure 30. Charge storage layer 24 is between the select gate and control gate of NVM gate structure 30 and between the select gate and control gate of NVM gate structure 32.

Figure 6:
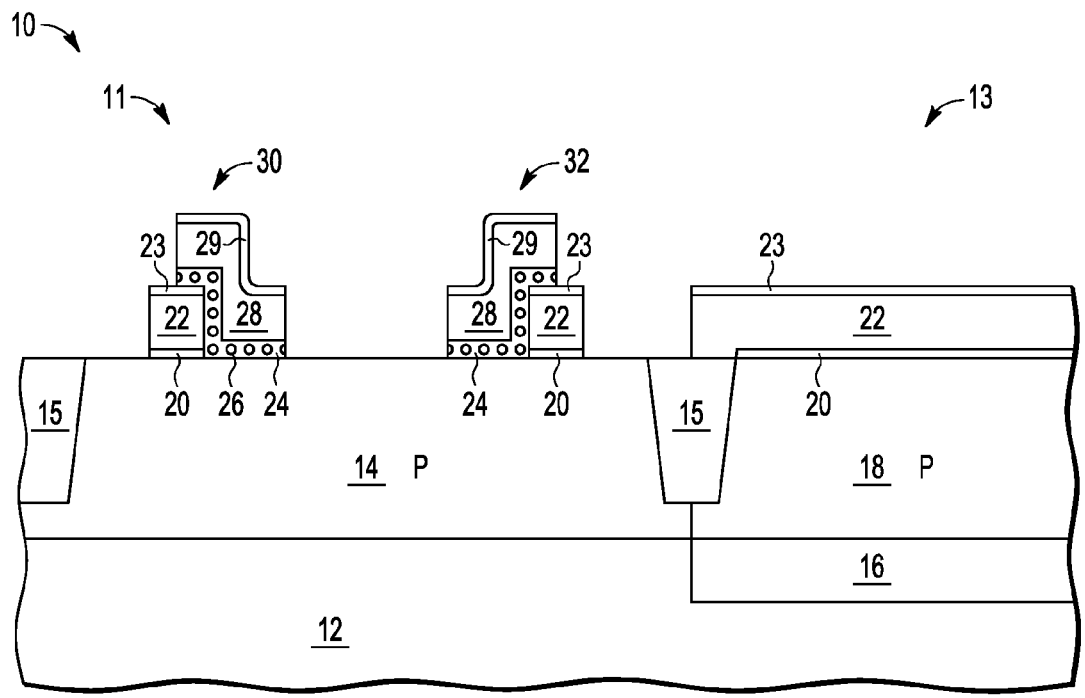
FIG. 6 is a cross section of the semiconductor structure of FIG. 5 at a subsequent stage in processing.

Shown in FIG. 6 is semiconductor structure 10 after removing charge storage layer 24 from over substrate 12 and logic region 13 and leaving charge storage layer under the control gates and between the select gates and control gates.

Figure 7:
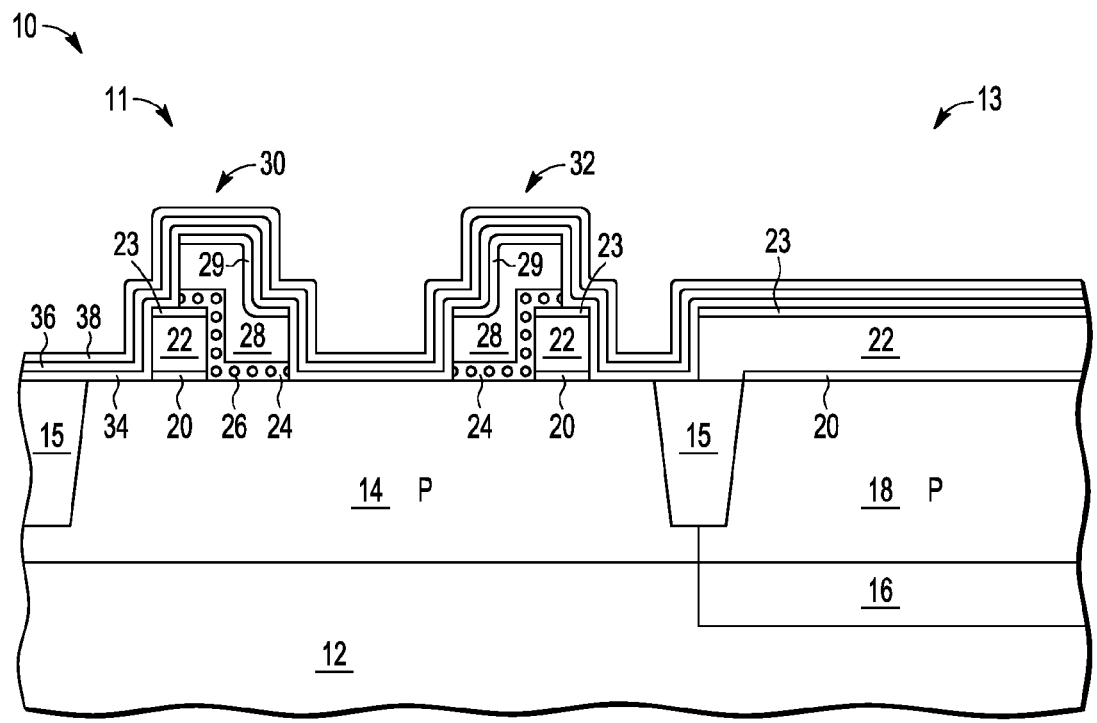
FIG. 7 is a cross section of a semiconductor structure at a stage in processing according to a second embodiment.

Shown in FIG. 7 is semiconductor structure 10 after depositing an oxide layer 34, a nitride layer 36 on oxide layer 34, and an oxide layer 38 on nitride layer 36. Oxide layer 34 provides protection for the polysilicon from nitride layer 36.

Figure 8:
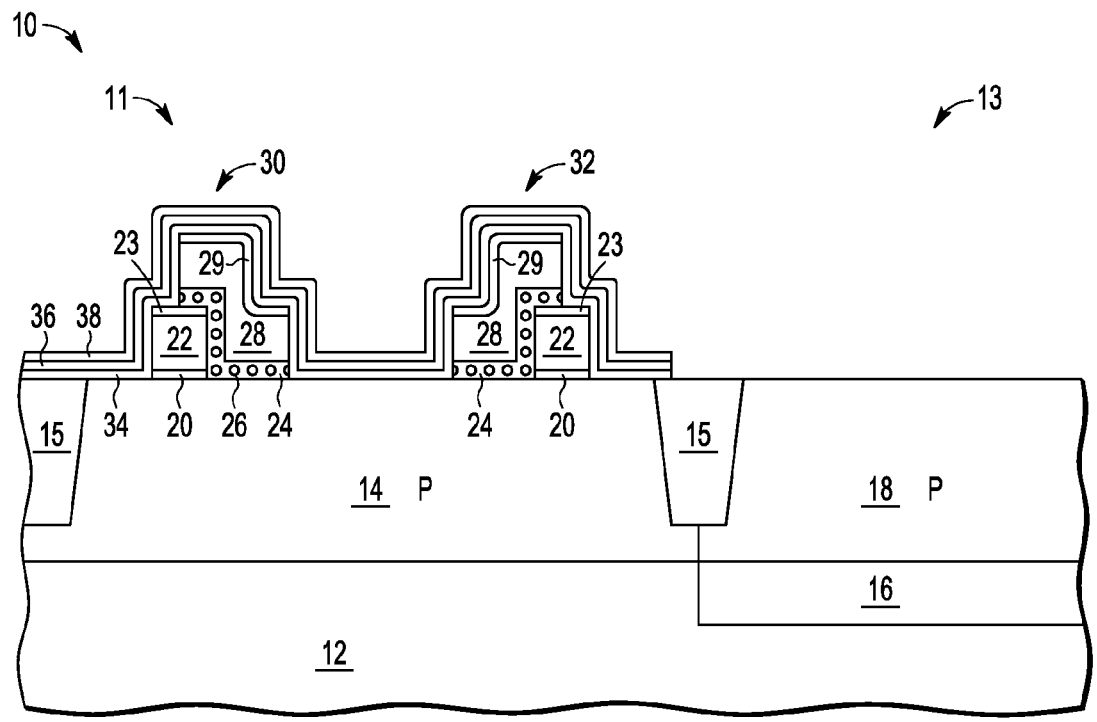
FIG. 8 is a cross section of the semiconductor structure of FIG. 7 at a subsequent stage in processing.

Shown in FIG. 8 is semiconductor structure 10 after removing oxide layer 34, nitride layer 36, oxide layer 38, polysilicon 22 and oxide 20 from logic region 13. The remaining portion of oxide layer 34, nitride layer 36, and oxide layer 38 over NVM region functions as a hard mask.

Figure 9:
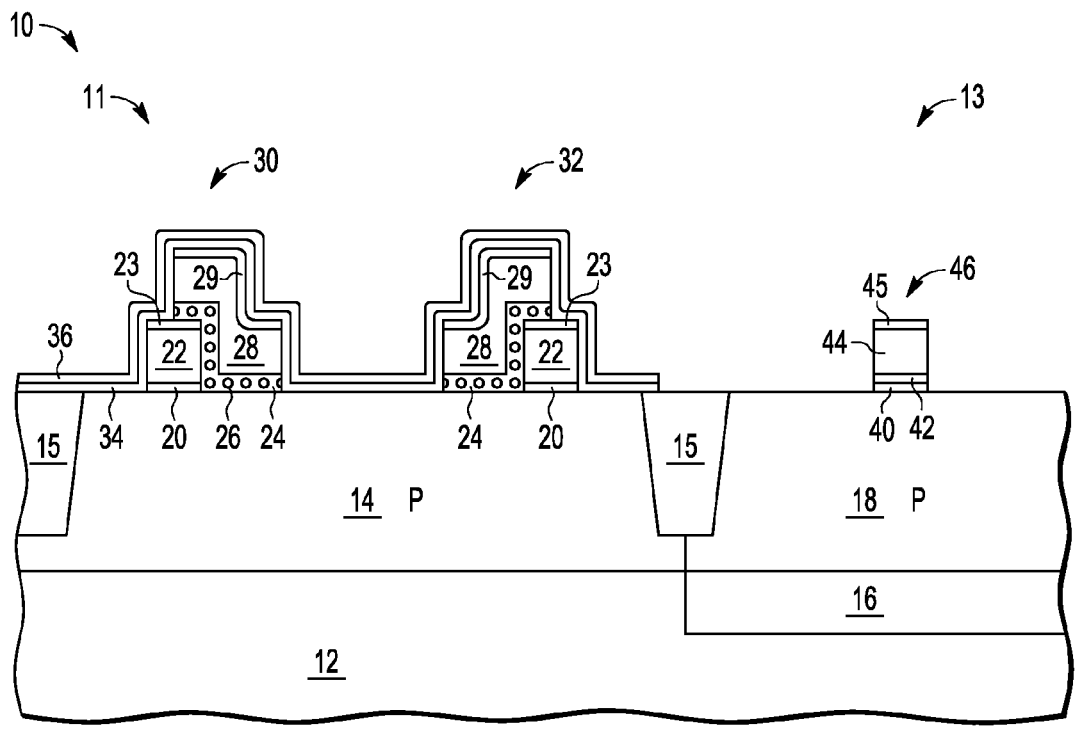
FIG. 9 is a cross section of the semiconductor structure of FIG. 8 at a subsequent stage in processing.

Shown in FIG. 9 is semiconductor structure 10 after forming a layer of high-k dielectric 40 on substrate 12 in logic region 13 and over the hard mask of oxide layer 34, nitride layer 36, and oxide layer 38 in NVM region 11.

Barrier metal 42 is then deposited over high-k dielectric 40 for the P wells. Barrier metal 42 can function as a work function metal for P wells, such as P well 18, and for providing a highly conductive gate conductor for both the N and P channel transistors. A polysilicon layer 44 is deposited over barrier metal 42 and a cap layer 45 (such as a nitride) is deposited over polysilicon layer 44.

Cap layer 45, polysilicon layer 44, barrier metal 42, and high-k dielectric 40 in logic region 13 are then selectively etched to leave a logic gate 46 in logic region 13. The etch of metal 42 has the effect of metal making contact with NVM region 11 which can be a contaminant to charge storage layer 24, especially when charge storage layer 24 has nanocrystals. The hard mask formed by oxide layer 34 and nitride layer 36 prevents the metal from contaminating NVM structures 30 and 32. Oxide layer 38 in NVM region 11 is removed by a pre-clean prior to deposition of high-k dielectric 40.

Figure 10:
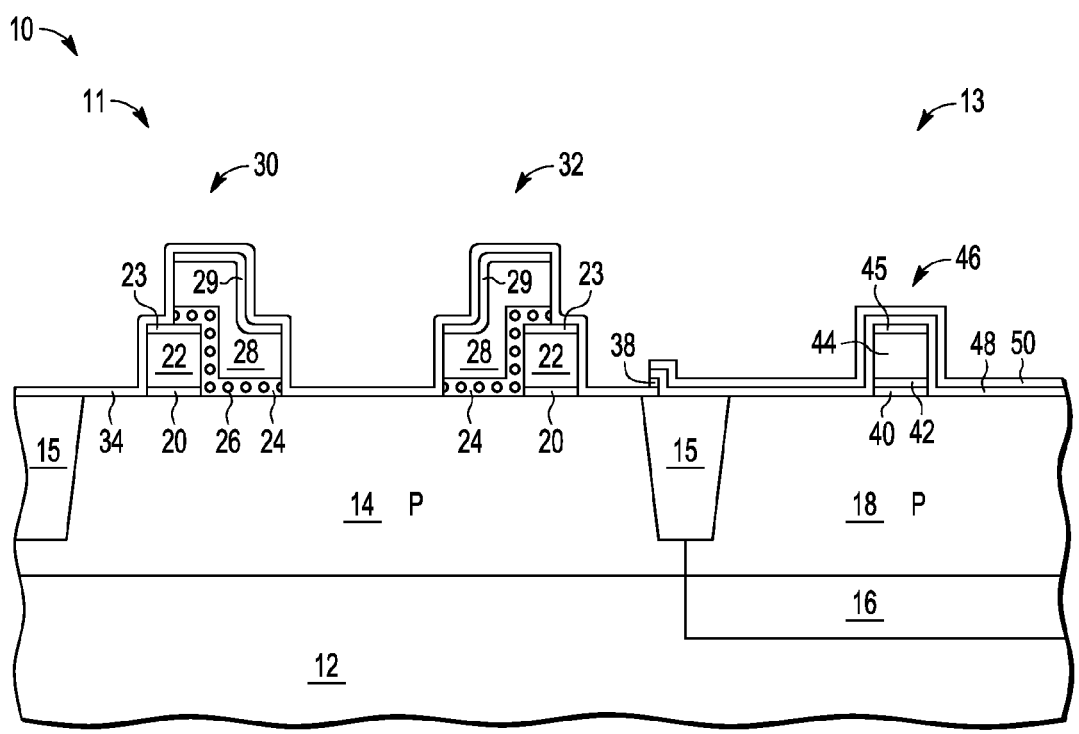
FIG. 10 is a cross section of the semiconductor structure of FIG. 9 at a subsequent stage in processing.

Shown in FIG. 10 is semiconductor structure 10 after depositing a nitride layer 48 and an oxide layer 50 on nitride layer 48. In NVM region 11, nitride layer 48 is on nitride layer 36. There is then an oxide-nitride-oxide layer of oxide layer 34, nitride layers 36 and 48, and oxide layer 50 in NVM region 11. In logic region 13, nitride layer 48 is on substrate 12, although a thin native oxide layer may be between substrate 12 and nitride layer 48, and on logic gate structure 46. Oxide layer 50 is on nitride layer 48. Oxide layers 34 and 50 and nitride layers 36 and 48 are conformal.

A patterned etch of oxide layer 50 is then performed to remove oxide layer 50 from NVM region 11 and leave oxide layer 50 in logic region 13.

A selective etch of nitride layers 36 and 48 is performed using oxide layer 50 as a hard mask in logic region 13. Nitride layers 36 and 48 are thus removed from NVM region 11 and nitride layer 48 is retained in logic region 13. The use of oxide layer 50 as a hard mask allows for this selective etch of nitride layers 36 and 48 to be achieved without requiring a mask step using photoresist.

Figure 11:
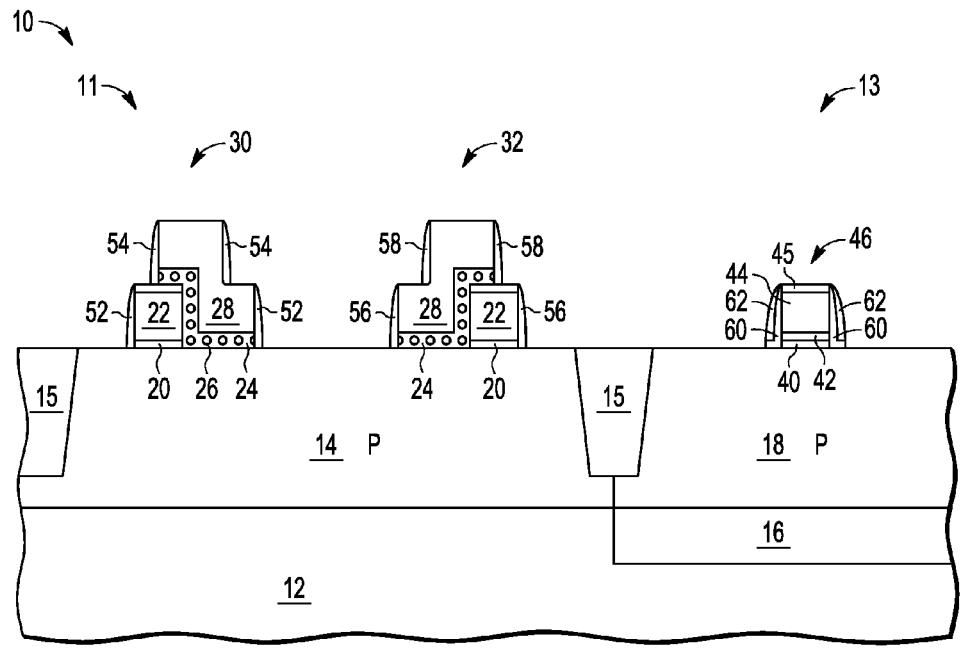
FIG. 11 is a cross section of the semiconductor structure of FIG. 10 at a subsequent stage in processing.

Shown in FIG. 11 is semiconductor structure 10 after performing an anisotropic etch of oxide and a subsequent nitride etch that results in oxide layer 34 becoming sidewall spacers 52, 54, 56, and 58 around NVM gate structures 30, 32 in NVM region 11. Oxide layer 50 becomes sidewall spacer 60, and nitride layer 48 becoming a sidewall spacer 62 around logic control gate 46. Sidewall spacer 52 is around a lower portion of NVM gate structure 30 adjacent to the select gate on one side and the control gate on the other side. Sidewall spacer 54 surrounds an upper portion of the NVM gate structure 30 adjacent to an upper portion of the control gate. Sidewall spacer 56 is around a lower portion of NVM gate structure 32 adjacent to the select gate on one side and the control gate on the other side. Sidewall spacer 58 surrounds an upper portion of the NVM gate structure 32 adjacent to an upper portion of the control gate. Sidewall spacer 60 is around logic gate structure 46. The etch of nitride layer 48 removes nitride layer 48 from over substrate 12 and over the horizontal top surface of logic gate structure 46. The result is a sidewall spacer 62 of nitride around logic gate structure 46 that may also be called a liner under sidewall spacer 60.

Figure 12:
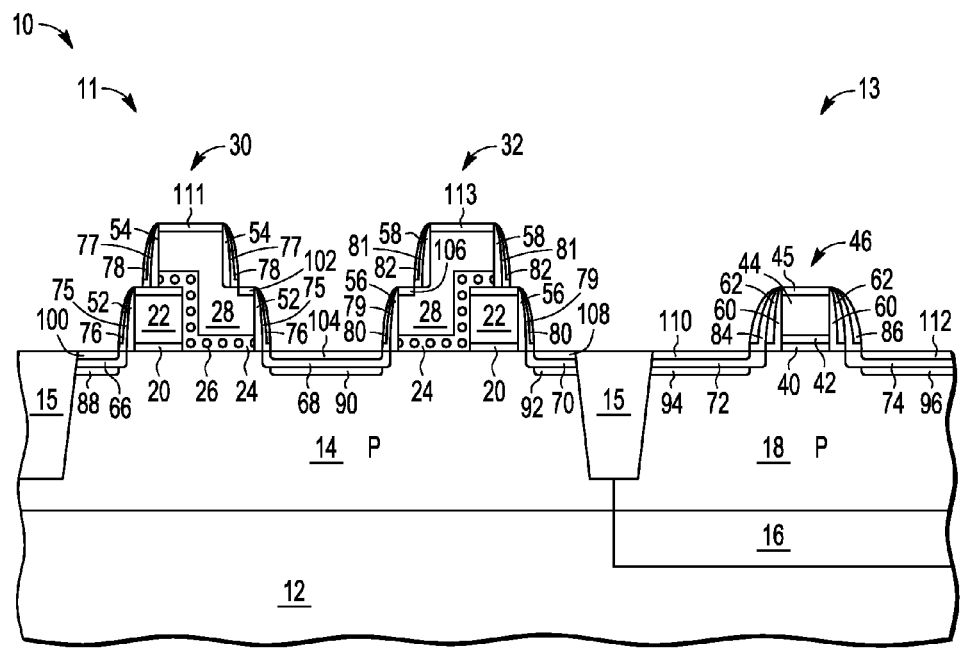
FIG. 12 is a cross section of the semiconductor structure of FIG. 11 at a subsequent stage in processing.

Shown in FIG. 12 is semiconductor structure 10 after receiving a source/drain implant that forms source/drain regions 66, 68 and 70 in NVM region 11 and source/drain regions 72 and 74 in logic region 13 in substrate 12. In particular source/drain region 66 is in well 14 nearly aligned to the select gate of NVM gate structure 30, source/drain region 68 is in P well 14 nearly aligned to the control gates of NVM gate structures 30 and 32, and source/drain region 70 is in P well 14 and nearly aligned to the select gate of NVM gate structure 32. The implant forms the source/drain regions that, after processing is complete, define channel length. Source/drain regions 72 and 74 are nearly aligned to opposing sides of logic gate structure 46. The presence of sidewall spacer 62 results in source/drain regions 72 and 74 are further from being aligned to the sides of logic gate structure 46 than source/drain regions 66, 68, and 70 are from being aligned to the select gates and control gates of NVM gate structures 30 and 32. The source/drain regions shown are N type.

A second set of sidewall liners 75, 77, 79, 81, 84 of oxide and spacers 76, 78, 80, 82 and 86 of nitride are then formed around sidewall spacers 52, 54, 56, 58, and 62, respectively.

An implant that is further spaced from gate edges due to sidewall spacers 76, 78, 80, 82, and 86 is then performed that results in more heavily doped source/drain regions 88, 90, 92, 94, and 96 which are somewhat deeper and result in portions of source/drain regions 66, 68, 70, 72, and 74, respectively, having higher doping concentrations thus having higher conductivity. This completes the steps for formation of the NVM cells and the logic transistor. These more heavily doped regions can then be silicided to make low resistance contacts 100, 102, 104, 106, 108, 110, 112. The tops of polysilicon control gates 28 can also be silicided to make contacts 111, 113.

Figure 13:
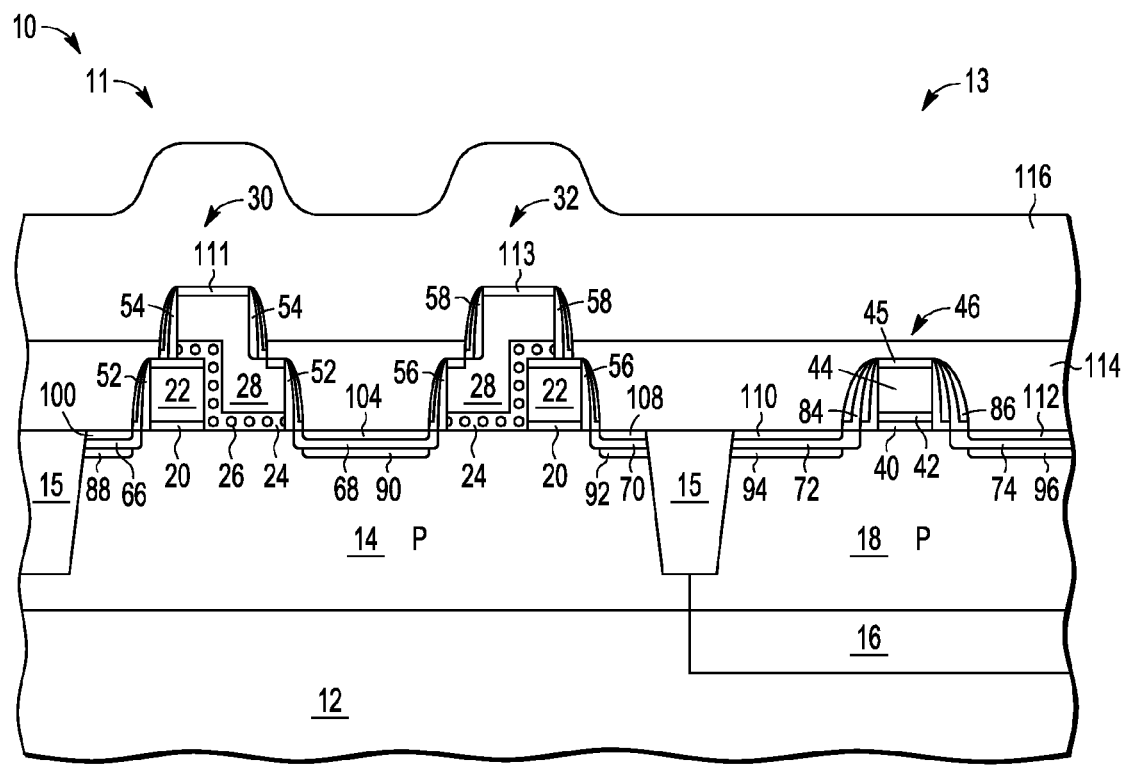
FIG. 13 is a cross section of the semiconductor structure of FIG. 12 at a subsequent stage in processing.

Shown in FIG. 13 is semiconductor structure 10 after interlayer dielectric (ILD) 114 is conformally deposited in NVM region 11 and logic region 13. ILD 114 is then planarized using chemical mechanical polishing (CMP) to a height that remains above the top of logic gate 46 and NVM cells 30, 32, for example by 200 Angstroms or more above the height of control gate 28. ILD 114 is then etched to recess ILD to a height that remains above logic gate 46 but may be below the top of the control gate 28 and above the top of select gates 22 in NVM cells 30, 32. A layer of polysilicon is then conformally deposited over recessed ILD 114 in NVM region 11 and logic region 13.

Figure 14:
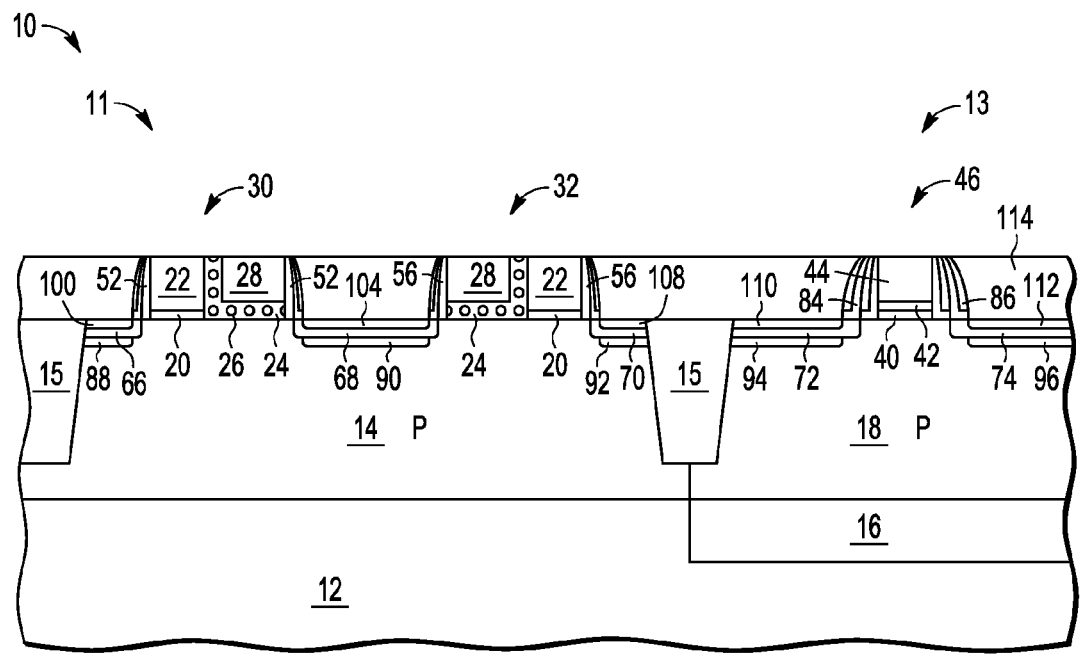
FIG. 14 is a cross section of the semiconductor structure of FIG. 13 at a subsequent stage in processing.

Shown in FIG. 14 is semiconductor structure 10 after a polysilicon layer 116 and a portion of recessed ILD 114 are removed and planarized using CMP. A portion of the control gate for logic device 46, and cap layer 23, a portion of control gates 28, and a portion of charge storage layer 24 over select gates 22 of NVM cells 30, 32, is removed. The use of polysilicon layer 116 over ILD 114 before the CMP helps prevent damage to the polysilicon in the control gates 28 of NVM cells 30, 32 during the CMP planarization.

Figure 15:
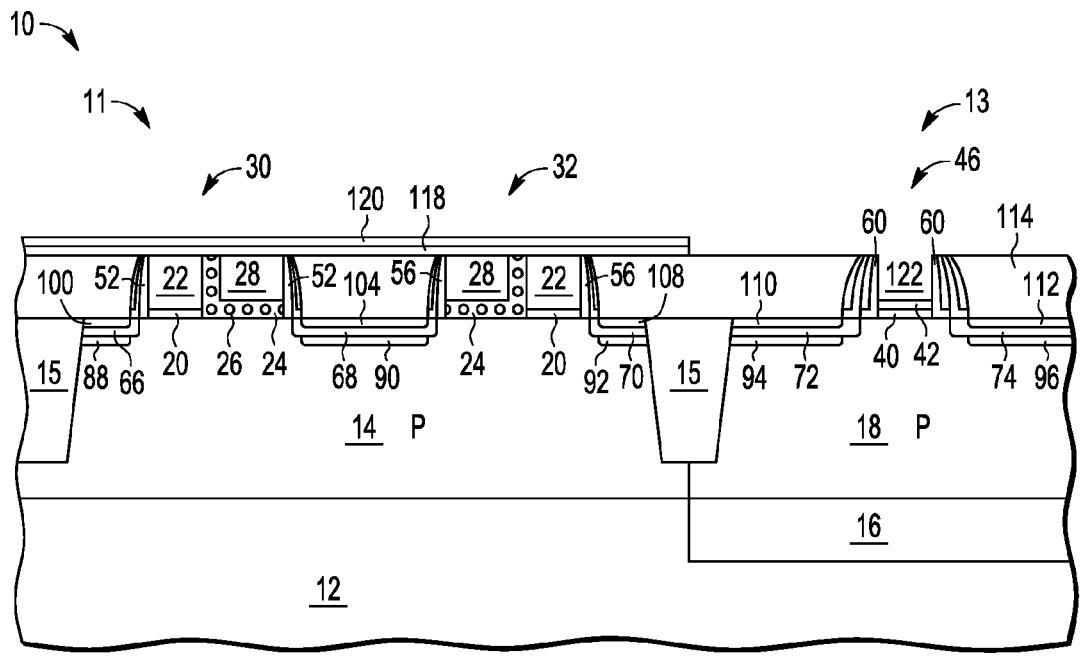
FIG. 15 is a cross section of the semiconductor structure of FIG. 14 at a subsequent stage in processing.

Shown in FIG. 15 is semiconductor structure 10 after a hard mask is formed over NVM region 11 including a layer of nitride 118 and a layer of oxide 120. Sacrificial polysilicon gate 44 is removed from logic structure 46 using a wet etch to form a gate opening 122 surrounded by first spacer 60 for logic structure 46.

Figure 16:
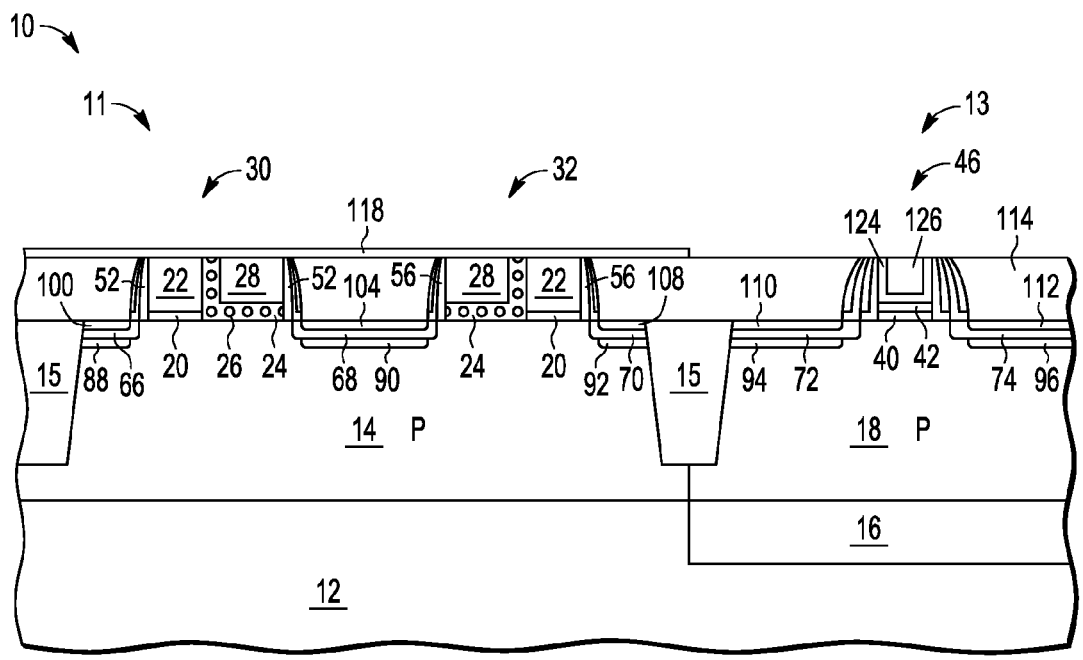
FIG. 16 is a cross section of the semiconductor structure of FIG. 15 at a subsequent stage in processing.

Shown in FIG. 16 is semiconductor structure 10 after work function metal 124 is deposited around the sides and bottom of the gate opening 122 in logic structure 46. A gate metal 126 is then deposited over the work function metal 124 to fill the gate opening 122. Combinations of work function metal 124 and the barrier metal 42 (FIG. 11) sets the work function of N channel transistors and provides a highly conductive gate conductor in logic region 13. An alternate combination of barrier metal and work function material can be used for P channel transistors.

After gate metal 126 is deposited in logic structure 46, oxide layer 120 is removed by CMP over NVM region 11 and logic region 13. Nitride layer 118 can be left in NVM region 11 or removed.

Figure 17:
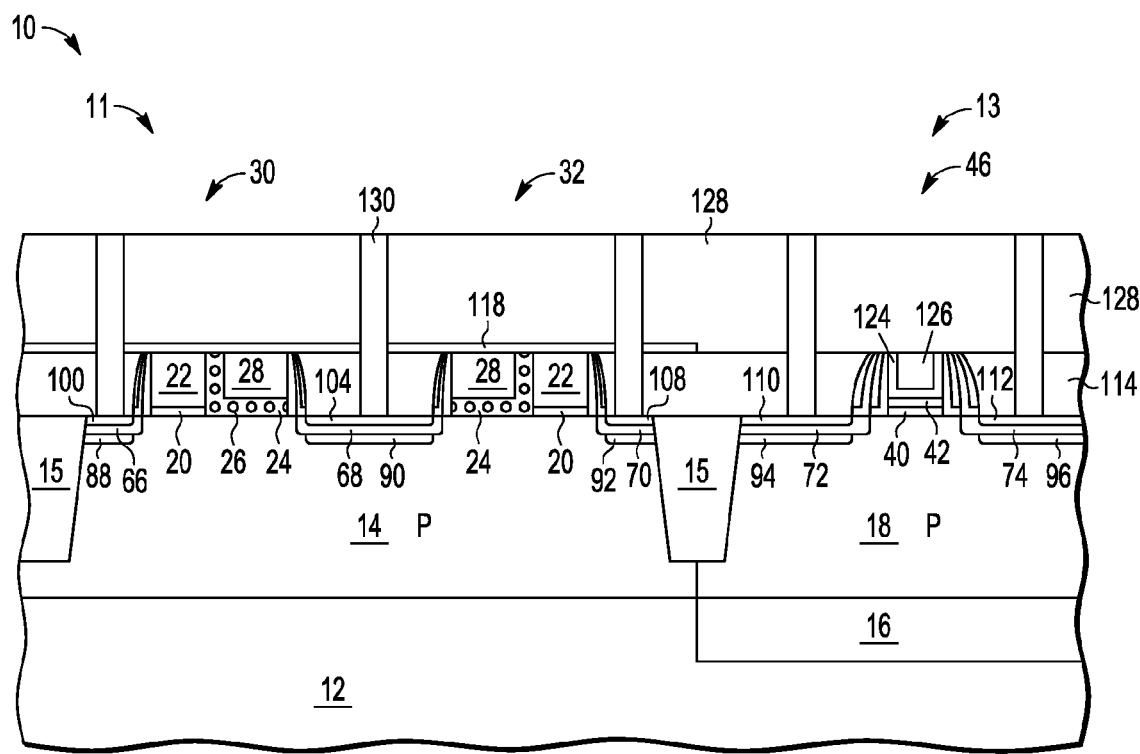
FIG. 17 is a cross section of the semiconductor structure of FIG. 16 at a subsequent stage in processing.

Shown in FIG. 17 is semiconductor structure 10 after an additional layer of interlayer dielectric 128 is deposited over nitride layer 118 in NVM region 11 and in logic region 13. Openings can be formed in dielectric 128 and filled with conductive material 130 to make contact with source/drain contacts 100, 104, 108, 110, 112 of NVM structures 30, 32 and logic structure 46.

Thus it is shown that metal gate transistors can be made in the presence of NVM cells, even if the NVM cells use nanocrystals, and further that the hard mask used during the metal etch can also subsequently be used in forming sidewall spacers used as an implant mask.

By now it should be appreciated that in some embodiments there has been provided a method of making a semiconductor structure (10) using a substrate (12), wherein the semiconductor structure comprises a logic device (46) in a logic region (13) and a non-volatile memory (NVM) device (30) in an NVM region (11). The method can comprise forming an NVM structure (30) in the NVM region, wherein the NVM structure comprises a control gate structure (28) and a select gate structure (22). A protective layer (34, 36, 38) is formed over the NVM structure. A gate dielectric layer (40) is formed over the substrate in the logic region, wherein the gate dielectric layer comprises a high-k dielectric. A sacrificial gate (44) is formed over the gate dielectric layer in the logic region. A first dielectric layer is formed (114) around the sacrificial gate. Chemical mechanical polishing is performed on the NVM region and the logic region after forming the first dielectric layer. The sacrificial gate is replaced with a metal gate structure (124, 126).

In another aspect, the forming the NVM structure can be further characterized by the select gate having a top surface and the control gate structure having an upper portion overlapping a portion of the top surface of the select gate.

In another aspect, wherein performing chemical mechanical polishing includes depositing a layer of polysilicon (116) over the top of the control gate and then removing the upper portion of the control gate that overlaps the portion of the top surface of the select gate.

In another aspect, the method can further comprise performing the source/drain implants (66, 68, 70, 72, 74, 88, 90, 92, 94, 96) in the NVM region and the logic region prior to forming the first dielectric layer.

In another aspect, the method can further comprise forming a first sidewall spacer (60, 62) around the sacrificial gate after forming the first sidewall spacer and before forming the first dielectric layer.

In another aspect, the replacing the sacrificial gate can comprise removing the sacrificial gate to leave an opening (122) over the gate dielectric layer; and forming a work function metal (124) in the opening.

In another aspect, the replacing the sacrificial gate further can comprise forming a metal gate (126) on the work function metal.

In another aspect, the forming the NVM structure can be further characterized by forming a capping layer (23) on the top surface of the select gate.

In another aspect, the forming the capping layer can be characterized by the capping layer comprising nitride.

In another aspect, the performing the chemical mechanical polishing can be further characterized as leaving at least a portion of the capping layer over the select gate structure.

In another aspect, the protective layer comprises a first oxide layer (34), a nitride layer (36) on the first oxide layer, and a second oxide layer (38) on the nitride layer.

In another aspect, the method can further comprise removing the second oxide layer and the nitride layer; and anisotropically etching the first oxide layer to form a sidewall spacer (52) around the select gate structure and the control gate structure.

In another aspect, the forming the NVM structure is further characterized by the control gate structure and the select gate structure comprising polysilicon.

In further embodiments, a method of making a semiconductor structure (10) using a substrate (12) is provide, wherein the semiconductor structure comprises a logic device (46) in a logic region (13) and a non-volatile memory (NVM) device (30) in an NVM region (11). The method can comprise forming an NVM structure (30) in the NVM region, wherein the NVM structure comprises a control gate structure (28) and a select gate structure (22) in which the control gate structure has an upper portion extending over a portion of a top surface of the select gate structure. A replacement gate structure (40, 42, 44, 45) is formed in the logic region having a sacrificial gate (44). Chemical mechanical polishing is performed on the logic region and the NVM region which removes the upper portion of the control gate structure. The sacrificial gate is replaced with a metal gate structure (124, 126).

In another aspect, the forming the replacement gate structure can comprise forming a gate dielectric (40) comprising a high-k dielectric.

In another aspect, the forming the replacement gate structure can be further characterized by the sacrificial gate comprising polysilicon; and further comprises forming a barrier layer (42) on the gate dielectric.

In another aspect, the replacing the sacrificial gate is further characterized by the metal gate structure comprising: a work function metal (124) on the barrier layer; and a metal gate (126) on the work function metal.

In another aspect, the method can further comprise forming a protection layer (34, 36, 38) over the NVM region after forming the NVM structure and before forming the replacement gate structure.

In another aspect, the method can further comprise forming a capping layer (23) over the select gate prior to forming the protection layer; and removing a portion of the capping layer during the performing the chemical mechanical polishing.

In still other embodiments, a method of making a semiconductor structure (10) using a substrate (12), wherein the semiconductor structure comprises a logic device (46) in a logic region (13) and a non-volatile memory (NVM) device (30) in an NVM region (11), can comprise forming an NVM structure (30) in the NVM region, wherein the NVM structure comprises a control gate structure (28) and a select gate structure (22) in which the control gate structure has an upper portion extending over a portion of a top surface of the select gate structure and the select gate structure has a nitride capping layer (23) on its top surface. A protection layer (34, 36, 38) is formed over the NVM region. A replacement gate structure (40, 42, 44, 45) is formed in the logic region having a high-k dielectric (40), a barrier layer (42) on the high-k dielectric, and a sacrificial gate (44). Chemical mechanical polishing is performed on the logic region and the NVM region which removes the upper portion of the control gate structure and leaves a portion of the nitride capping layer on the top surface of the select gate structure. The sacrificial gate is replaced with a work function metal (124) on the barrier layer and a metal gate (126) on the barrier layer.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate, wherein the semiconductor structure comprises a logic device in a logic region and a non-volatile memory (NVM) device in an NVM region, comprising:
   forming an NVM structure in the NVM region, wherein the NVM structure comprises a control gate structure and a select gate structure;
   forming a protective layer over the NVM structure;
   forming a gate dielectric layer over the substrate in the logic region after forming the protective layer over the NVM structure, wherein the gate dielectric layer comprises a high-k dielectric;
   forming a sacrificial gate over the gate dielectric layer in the logic region;
   forming a first dielectric layer around the sacrificial gate; and
   performing chemical mechanical polishing on the NVM region and the logic region after forming the first dielectric layer; and
   replacing the sacrificial gate with a metal gate structure.

2. The method of claim 1 wherein the forming the NVM structure is further characterized by the select gate having a top surface and the control gate structure having an upper portion overlapping a portion of the top surface of the select gate.

3. The method of claim 2, wherein performing chemical mechanical polishing includes depositing a layer of polysilicon over the top of the control gate and then removing the upper portion of the control gate that overlaps the portion of the top surface of the select gate.

4. The method of claim 3, further comprising performing the source/drain implants in the NVM region and the logic region prior to forming the first dielectric layer.

5. The method of claim 4, further comprising forming a first sidewall spacer around the sacrificial gate after forming the first sidewall spacer and before forming the first dielectric layer.

6. The method of claim 5, wherein the replacing the sacrificial gate comprises:
   removing the sacrificial gate to leave an opening over the gate dielectric layer; and
   forming a work function metal in the opening.

7. The method of claim 6, wherein the replacing the sacrificial gate further comprises forming a metal gate on the work function metal.

8. The method of claim 1 wherein the forming the NVM structure is further characterized by forming a capping layer on the top surface of the select gate.

9. The method of claim 8, wherein the forming the capping layer is characterized by the capping layer comprising nitride.

10. The method of claim 9, wherein the performing the chemical mechanical polishing is further characterized as leaving at least a portion of the capping layer over the select gate structure.

11. The method of claim 1, wherein the protective layer comprises a first oxide layer, a nitride layer on the first oxide layer, and a second oxide layer on the nitride layer.

12. The method of claim 11, further comprising:
   removing the second oxide layer and the nitride layer; and
   anisotropically etching the first oxide layer to form a sidewall spacer around the select gate structure and the control gate structure.

13. The method of claim 12 wherein the forming the NVM structure is further characterized by the control gate structure and the select gate structure comprising polysilicon.

14. A method of making a semiconductor structure using a substrate, wherein the semiconductor structure comprises a logic device in a logic region and a non-volatile memory (NVM) device in an NVM region, comprising:
- forming an NVM structure in the NVM region, wherein the NVM structure comprises a control gate structure and a select gate structure in which the control gate structure has an upper portion extending over a portion of a top surface of the select gate structure;
- forming a replacement gate structure in the logic region having a sacrificial gate;
- performing chemical mechanical polishing on the logic region and the NVM region which removes the upper portion of the control gate structure; and
- replacing the sacrificial gate with a metal gate structure.

15. The method of claim 14, wherein the forming the replacement gate structure comprises forming a gate dielectric comprising a high-k dielectric.

16. The method of claim 15, wherein the forming the replacement gate structure:
- is further characterized by the sacrificial gate comprising polysilicon; and
- further comprises forming a barrier layer on the gate dielectric.

17. The method of claim 16 wherein the replacing the sacrificial gate is further characterized by the metal gate structure comprising:
- a work function metal on the barrier layer; and
- a metal gate on the work function metal.

18. The method of claim 14 further comprising forming a protection layer over the NVM region after forming the NVM structure and before forming the replacement gate structure.

19. The method of claim 18 further comprising:
- forming a capping layer over the select gate prior to forming the protection layer; and
- removing a portion of the capping layer during the performing the chemical mechanical polishing.

20. A method of making a semiconductor structure using a substrate, wherein the semiconductor structure comprises a logic device in a logic region and a non-volatile memory (NVM) device in an NVM region, comprising:
- forming an NVM structure in the NVM region, wherein the NVM structure comprises a control gate structure and a select gate structure in which the control gate structure has an upper portion extending over a portion of a top surface of the select gate structure and the select gate structure has a nitride capping layer on its top surface;
- forming a protection layer over the NVM region
- forming a replacement gate structure in the logic region having a high-k dielectric, a barrier layer on the high-k dielectric, and a sacrificial gate;
- performing chemical mechanical polishing on the logic region and the NVM region which removes the upper portion of the control gate structure and leaves a portion of the nitride capping layer on the top surface of the select gate structure; and
- replacing the sacrificial gate with a work function metal on the barrier layer and a metal gate on the barrier layer.

* * * * *